United States Patent [19]

Seno et al.

[11] Patent Number: 5,327,382
[45] Date of Patent: Jul. 5, 1994

[54] METHOD OF TESTING REDUNDANT MEMORY CELLS

[76] Inventors: Katsunori Seno, c/o Device Tech. Div. Ulsi R & D Group, Atsugi Tech. Center Sony Corporation, Atsugi-shi Kanagawa-Ken, Japan; Kurt Knorpp, c/o Sony Microelectronics Design Center Sony Corporation, 6118 River Oaks Pkwy., Redwood City, Calif. 95134

[21] Appl. No.: 942,627

[22] Filed: Sep. 9, 1992

[51] Int. Cl.⁵ .............................. G11C 7/00
[52] U.S. Cl. .............................. 365/210
[58] Field of Search .......... 365/210, 200, 201; 371/60.2, 60.3

[56] References Cited

U.S. PATENT DOCUMENTS 5,091,884  2/1992  Kagami .................. 365/201
5,113,371  5/1992  Hamada .................. 365/201
5,148,398  9/1992  Kohno ................... 365/201

Primary Examiner—Eugene R. LaRoche
Assistant Examiner—Tan Nguyen
Attorney, Agent, or Firm—Hill, Steadman & Simpson

[57] ABSTRACT

In a single chip semiconductor memory, having independent memory areas for normal memory cells and redundant memory cells, the redundant cells are tested in a parallel or multi-bit test mode simultaneously with the normal cells they replace, by enabling the redundant memory area in response to simultaneous detection of the state of the multi-bit test mode, the presence of a programmed redundant bit for a memory cell under test, and the operative selection of the normal memory matrix.

2 Claims, 1 Drawing Sheet ba bn=bit

Ra-i redundant bit

METHOD OF TESTING REDUNDANT MEMORY CELLS

FIELD OF THE INVENTION

The present invention relates to single chip semiconductor memories, and more particularly to such memories having redundant memory cells.

BACKGROUND

It has become usual in connection with large scale memories to provide an area for redundant memory cells, so that a defective memory cell in the main memory area does not make the entire memory unusable.

It is desirable, in order to reduce the manufacturing costs of large scale memories, to provide accelerated methods of testing the memory cells, to insure that the entire memory cell array operates properly. In order to facilitate the testing, it has been proposed to test a number of memory cells simultaneously within the main memory area, but heretofore it has not been possible to test portions of the redundant memory areas simultaneously with the main memory. Thus, it has been necessary to test the redundant areas separately, which prolongs the testing procedure and renders the finished memory arrays more expensive because of the time and effort required for testing them completely.

Accordingly, it is a principal object of the present invention to provide a method for testing memory areas which have been set aside as redundant, at the same time as the testing of the other memory areas of the main memory. This allows the testing process to proceed more rapidly, and a separate testing procedure is not required for the redundant memory areas.

These and other objects and advantages of the present invention will become manifest by inspection of the following description and the accompanying drawings.

In one embodiment of the present invention, there is provided a control circuit located on the chip in operative association with a single chip semiconductor memory having a redundant semiconductor memory portion, for enabling access to the redundant semiconductor memory area for reading. The control circuit is enabled by the simultaneous occurrence of a select signal, which functions to select a given portion of the main memory area, a second signal indicating that the multiple bit test (MBT) mode is active, and a further signal describing that the redundant memory area has been programmed.

BRIEF DESCRIPTION OF THE DRAWINGS

Reference will now be made to the accompanying drawings, in which.

DESCRIPTION OF THE PREFERRED EMBODIMENT

Figure 1A:
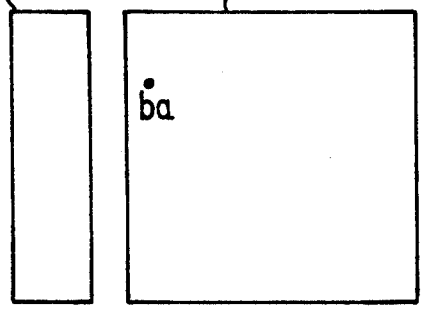
FIG. 1A is an illustration of a semiconductor memory having a redundant memory section, during a process of reading a single bit normally.

In FIG. 1A, block numbers 1 and 2 represent arrays of regular and redundant memory cells respectively. The array of redundant memory cells is segregated from the normal memory cell array. In a regular read access, as shown in FIG. 1A, only the contents of a single memory cell in the memory array is read. This is indicated in FIG. 1A by a single dot within the array. If the memory location being read is not redundant, the physical location of the memory cell is in the normal array, as shown. On the other hand, if the memory location being addressed was programmed to use a redundant bit, the actual physical memory cell being accessed would come from the redundant array in section 2.

Figure 1B:
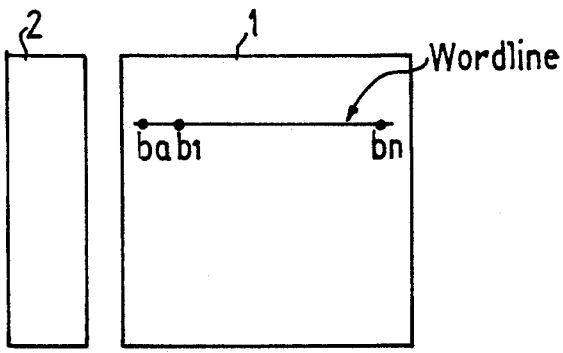
FIG. 1B is an illustration of the same memory, during a process in which multiple bits are being simultaneously tested in the main memory.

FIG. 1B shows the multi-bit test mode. In this mode, all the memory cells along one word line are simultaneously accessed. The word lines for the redundant section are different, and are separately selected, making it impossible to test the redundant bit with the normal selection in the MBT mode.

Figure 1C:
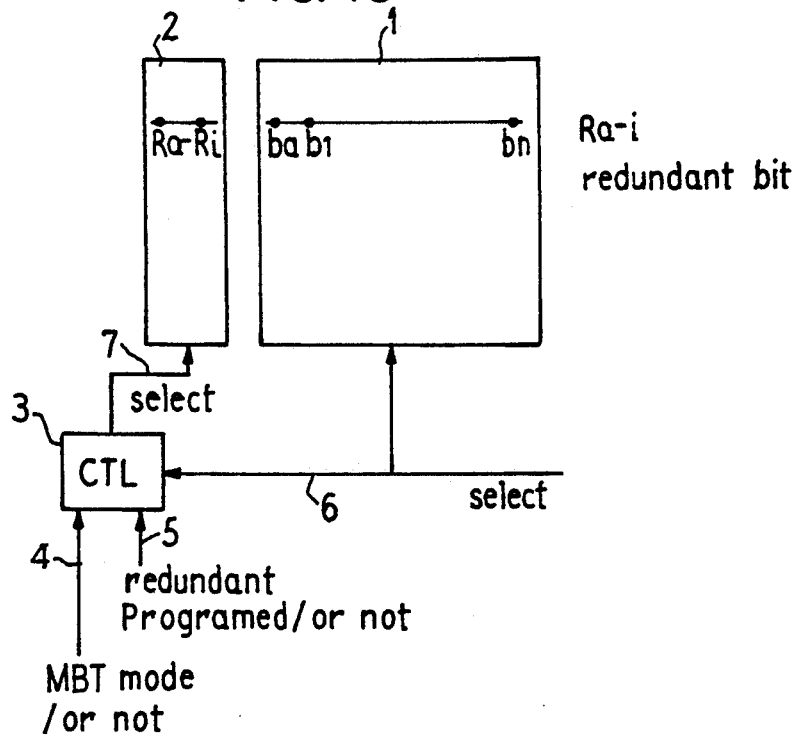
FIG. 1C is an illustration of the same memory in association with the control circuit of the present invention.

FIG. 1C shows the memory sections 1 and 2 in association with the control circuit 3 of the present invention. The control circuit 3 has three inputs. One input 4 is enabled when the MBT mode is activated, and a second input 5 is enabled when the memory section being addressed has a programmed redundant memory. A third input 6 is enabled when the main memory 1 is selected. When all three of these inputs coincide, a signal is produced on an output line 7, which is connected to the select input of the redundant memory block 2. This causes the redundant bits to be activated and tested along the selected bits in the normal memory section.

Accordingly, it is feasible by means of the present invention to test redundant bits in the MBT mode, so that no separate additional testing of the redundant memory areas is required.

It will be apparent that various modifications and additions may be made in the subject matter of the present invention without departing from the essential features of novelty thereon, which are intended to be defined and secured by the appended claims.

What is claimed is:

1. A method of testing a single chip semiconductor memory having plural normal memory cells arranged in a matrix and a plurality of word lines arranged in rows for simultaneously selecting a row of such cells for reading access, a plurality of redundant memory cells arranged in an independent matrix, with a plurality of word lines for selecting a row of said redundant memory cells for reading access, said method comprising the steps of detecting when a memory test is being executed, simultaneously detecting whether a memory cell being accessed during said reading access has a programmed location in said redundant memory matrix, and simultaneously detecting that said matrix of normal memory cells is selected for reading, and selecting said redundant matrix for reading in response to said three simultaneous detections.

2. Apparatus for testing a single chip semiconductor memory having plural normal memory cells arranged in a matrix and a plurality of word lines arranged in rows for simultaneously selecting a row of such cells for reading access, and a plurality of redundant memory cells arranged in an independent matrix comprising a gate having a first input connected to receive a signal indicating that a memory test is being executed, a second input connected to receive a signal indicating that a memory cell being accessed has a programmed location in said redundant memory, and a third input connected to receive a signal indicating that said matrix of normal cells is selected for operation; and means for connecting an output of said gate to said redundant memory cell matrix, whereby said redundant memory cell matrix is enabled for reading simultaneously with said normal memory array.

* * * * *